US007012012B2

(12) United States Patent
Yeom et al.

(10) Patent No.: US 7,012,012 B2
(45) Date of Patent: *Mar. 14, 2006

(54) METHOD OF ETCHING SUBSTRATES

(75) Inventors: Geun-young Yeom, Seoul (KR);
Myung cheol Yoo, Pleasanton, CA (US); Wolfram Urbanek, San Jose, CA (US); Youn-joon Sung, Seoul (KR); Chang-hyun Jeong, Pusan (KR); Kyong-nam Kim, Daejeon (KR); Dong-woo Kim, Chungbuk (KR)

(73) Assignee: LG Electronics Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/928,202

(22) Filed: Aug. 30, 2004

(65) Prior Publication Data

US 2005/0026396 A1    Feb. 3, 2005

Related U.S. Application Data

(63) Continuation of application No. 10/118,318, filed on Apr. 9, 2002, now Pat. No. 6,818,532.

(51) Int. Cl.
*H01L 21/46* (2006.01)
*H01L 21/302* (2006.01)
(52) U.S. Cl. .................... 438/462; 438/710; 438/714
(58) Field of Classification Search ............... 438/460, 438/462, 464, 691, 710, 706, 714, 718
See application file for complete search history.

(56) References Cited

U.S. PATENT DOCUMENTS

| 5,607,542 | A  | * | 3/1997  | Wu et al. ............... 156/643.1 |
| 5,972,781 | A  | * | 10/1999 | Wegleiter et al. ........... 438/640 |
| 6,027,595 | A  | * | 2/2000  | Suleski ..................... 156/230 |
| 6,261,929 | B1 | * | 7/2001  | Gehrke et al. ............. 438/478 |
| 6,294,456 | B1 | * | 9/2001  | Lee et al. .................. 438/623 |
| 6,518,206 | B1 | * | 2/2003  | Kumar et al. .............. 438/952 |
| 6,569,343 | B1 | * | 5/2003  | Suzuki et al. ................ 216/27 |
| 6,579,802 | B1 | * | 6/2003  | Pierson et al. ............. 438/706 |
| 6,844,569 | B1 | * | 1/2005  | Lee et al. .................... 257/79 |
| 6,884,717 | B1 | * | 4/2005  | Desalvo et al. ............ 438/667 |
| 2002/0098448 | A1 | * | 7/2002 | Yoshida et al. ............ 430/311 |
| 2003/0114017 | A1 | * | 6/2003 | Wong et al. ................ 438/778 |

* cited by examiner

*Primary Examiner*—T. N. Quach
(74) *Attorney, Agent, or Firm*—McKenna Long & Aldridge LLP

(57) ABSTRACT

Thinning and dicing substrates using inductively coupled plasma reactive ion etching (ICP RIE). When dicing, a hard photo-resist pattern or metal mask pattern that defines scribe lines is formed on a sapphire substrate or on a semiconductor epitaxial layer, beneficially by lithographic techniques. Then, the substrate is etched along the scribe lines to form etched channels. An etching gas comprised of $BCl_3$ and/or $BCl_3/Cl_2$ gas is used (optionally, Ar can be added). Stress lines are then produced through the substrate along the etched channels. The substrate is then diced along the stress lines. When thinning, a surface of a substrate is subjected to inductively coupled plasma reactive ion etching (ICP RIE) using $BCl_3$ and/or $BCl_3/Cl_2$ gas, possibly with some Ar. ICP RIE is particularly useful when working sapphire and other hard substrates.

20 Claims, 4 Drawing Sheets

METHOD OF ETCHING SUBSTRATES

This application is a continuation of application Ser. No. 10/118,318, filed on Apr. 9, 2002, now U.S. Pat. No. 6,818,532.

BACKGROUND OF THE INVENTION

1. Field of the Invention

This invention relates to semiconductor fabrication. More specifically, the present invention relates to the use of reactive ion etching in semiconductor fabrication.

2. Discussion of the Related Art

Light emitting diodes, commonly referred to, as "LEDs" are well-known semiconductor devices that convert electrical current into light. The color of the light (wavelength) emitted by an LED depends on the semiconductor material that is used to fabricate the LED. This is because the wavelength of the emitted light depends on the semiconductor material's band-gap energy, which represents the energy difference between valence band and conduction band electrons.

Gallium-Nitride (GaN) has recently gained much attention from LED researchers because GaN has a band-gap energy that is suitable for emitting blue light. Blue light emitting LEDs are important because of the short wavelength of blue light, which is beneficial in applications such as optical recordings, and because of the possibility of producing a wide range of colors when used with red and green LEDs. Accordingly, GaN technology has been and continues to be rapidly evolving. For example, the efficiency of GaN LEDs has surpassed that of incandescent lighting. Thus, the market growth for GaN-based LEDs is rapid.

Despite the evolution of GaN technology, GaN-based devices are too expensive for most applications. One reason for this is the high cost of manufacturing GaN-based devices, which in turn is related to the difficulty of growing GaN epitaxial layers and then processing GaN devices grown on hard substrates, such as sapphire or silicon carbide.

High quality GaN epitaxially grown layers are typically fabricated on sapphire substrates. This is because sapphire lattice matches well with GaN. Furthermore, the sapphire crystal is chemically and thermally stable, has a high melting temperature, a high bonding energy (122.4 Kcal/mole), and a high dielectric constant. Chemically, sapphires are crystalline aluminum oxide, $Al_2O_3$.

Despite sapphire's numerous advantages, it has significant problems. For example, sapphires are extremely hard, have a crystal orientation without natural cleave angles, and are thus difficult to dice and mechanically polish (process steps that greatly assist the production of low-cost, high quality devices). Furthermore, sapphire's high bonding strength results in a chemical makeup that is resistant to wet chemical etching. As a result, sapphire requires special processing techniques when used as a device substrate.

Fabricating semiconductor devices on sapphire is typically performed by growing GaN epitaxial layer on a sapphire substrate using MOCVD (Metal Organic Chemical Vapor Deposition) or MBE (Molecular Beam Epitaxy). Then, a plurality of individual devices, such as GaN LEDs, are fabricated on the epitaxial layer using normal semiconductor processing techniques.

After the individual devices are fabricated the individual devices must be separated (diced) from the sapphire substrate. To do this the sapphire substrate is first mechanically ground, lapped, and/or polished to produce a thin wafer having a smooth backside. It should be noted that such mechanical steps are time consuming and expensive. After thinning and polishing, the sapphire substrate is attached to a supporting tape. Then, a diamond saw or stylus forms scribe lines between the individual devices. Such scribing typically requires at least half an hour to process one 2" substrate (wafer), adding even more to manufacturing costs. Additionally, since the scribe lines have to be relatively wide to enable subsequent dicing, device yields are reduced, adding even more to manufacturing costs. After scribing, the sapphire substrates are rolled using a steel roller, or applied to a shear cutting process, to produce stress cracks that subsequently dice or separate the individual semiconductor devices.

Because of cost considerations, in practice it is highly beneficial to process more than one substrate at a time. However, doing this by mechanical lapping and scribe line cutting is not currently practical. Thus, the mechanical work processes increase cost simply because each substrate must be individually worked. Furthermore, mechanical work processes tend to reduce yield simply because of the handling steps that are required.

Thus, while highly beneficial in many aspects, sapphire substrates have serious problems. Therefore, a new method of separating devices fabricated on sapphire substrates, or in general, on any other substrate, would be beneficial. Even more beneficial would be a new method of dicing devices with fewer mechanical handling steps. Such methods would be particularly useful if they enable increased device yield. Methods that also enable simultaneous processing of multiple substrates would be particularly useful. Also, a new method of dicing sapphire substrates at relatively fast speeds along thin, accurately controlled dice lines, and with minimal mechanical steps would be particularly beneficial. Furthermore, a non-mechanical method of thinning sapphire substrates would be particularly advantageous.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

The principles of the present invention provide a new method of dicing substrates to separate out individual semiconductor devices that were fabricated on the substrate. By using these principles, the number of acceptable individual semiconductor devices (chips) from some substrates can be increased, thus enhancing the productivity of the semiconductor fabrication process. The principles of the present invention are particularly useful when separating semiconductor devices, such as GaN LEDs, that are fabricated on extremely hard substrates, such as sapphire and silicon carbide.

A method of dicing substrates to separate individual semiconductor devices according to the principles of the present invention includes the step of forming a mask pattern on a substrate or on the device-side surface. The mask pattern includes scribe lines that expose the substrate or device-side surface for etching. Such a mask pattern is beneficially produced using photolithographic techniques and subsequent development. Beneficially, the mask pattern is comprised of a relatively thick, hard photo-resist, a hard metal mask (such as Cr, Mo, etc.), or a combination of metal and photo-resist. Then, the substrate or device-side surface is etched along the scribe lines using inductively coupled plasma reactive ion etching (ICP RIE). The etching gas is comprised of $BCl_3$ and/or $BCl_3/Cl_2$, possibly with Ar added. The etched result creates trenches that extend into the substrate. Then, the etched substrate is stress processed. The stress process produces stress lines that extend from the trenches through the substrate. The stress lines cause the substrate to separate in a controlled manner so as to separate the individual semiconductor devices. The stress can be applied in numerous ways, such as by applying a supporting tape that holds the substrate and then rolling a roller across the back of the supporting tape, or by forcing a knife edge toward the trenches. Beneficially, most of the processing steps can be performed simultaneously on a plurality of substrates.

The principles of the present invention are particularly useful when separating semiconductor devices fabricated on extremely hard substrates such as sapphire or SiC. Other substrates that can be used include Si, Gas, InP, ZnSe, ZnO, and GaP. The principles of the present invention can reduce the number of mechanical handling steps required while enabling simultaneous processing of multiple substrates. Furthermore, the principles of the present invention enable fast dicing of the hard substrate, with the dicing occurring along thin, accurately controlled scribe lines and with minimal mechanical working.

A method of dicing hard substrates according to the principles of the present invention includes forming a mask pattern (see above) on a hard substrate, with the mask pattern having scribe lines that expose the substrate or the device-side surface. Then, the substrate or device-side surface is etched along the scribe lines using inductively coupled plasma reactive ion etching (ICP RIE) with an etching gas comprised of $BCl_3$ and/or $BCl_3/Cl_2$, possibly with Ar added. Etching produces trenches that extend into the hard substrate. Then, the hard substrate is stressed. Stress processes can be applied by rolling, use of a knife-edge, or other suitable means. The resulting stress process produces stress lines that extend from the trenches through the hard substrate. The hard substrate can then be diced along the stress lines to separate individual devices.

Beneficially ICP RIE is performed such that the trenches are formed with notches at the bottom tip of the trenches. Such notches readily enable cleaving along the stress lines.

In addition, the principles of the present invention provide for methods of polishing a substrates using inductively coupled plasma reactive ion etching (ICP RIE), with the ICP RIE gas being $BCl_3$ and/or $BCl_3/Cl_2$, possibly with Ar added.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE ILLUSTRATED EMBODIMENTS

The following generally describes a process for dicing substrates to separate individual semiconductor devices and a process for thinning substrates. The described processes are particularly advantageous when dicing and thinning hard substrates such as sapphires and SiC. Other substrates that can be used include Si, GaAs, InP, ZnSe, ZnO, and GaP. All semiconductor devices fabricated on a hard semiconductor substrate can be separated with ICP RIE scribing method. Furthermore, some metals can be etched using the described process. However, it should be understood that following describes only some of the many different embodiments that are in accord with the principles of the present invention. Therefore, the present invention is to be understood as encompassing all of the embodiments covered by the claims that follow and by their equivalents.

The principles of the present invention make use of inductively coupled plasma reactive ion etching (ICP RIE) to separate individual semiconductor devices that were previously formed on a substrate. As a motivation for the present invention was separating GaN-based devices that were fabricated on sapphire, the illustrated embodiments are directed to dicing and thinning sapphire substrates. However, other materials can be similarly processed. Thus, a general process for dicing individual elements formed on a sapphire substrate will be described first, followed by more details about the ICP RIE process, in turn followed by a discussion of ICP RIE in substrate thinning and polishing.

Figure 1:
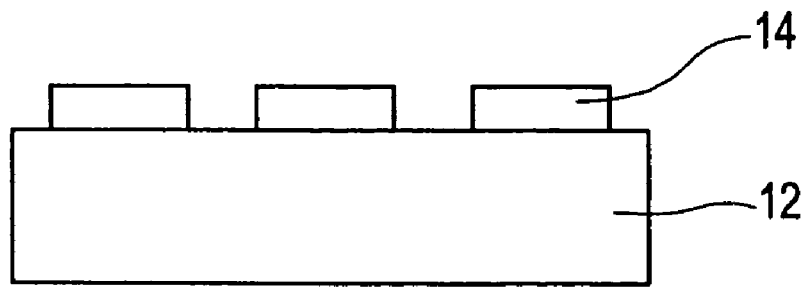
FIG. 1 illustrates a substrate having multiple individual semiconductor devices.

FIG. 1 illustrates a sapphire substrate 12 having multiple individual semiconductor devices 14. For example, the semiconductor devices might be GaN-based LEDs that are fabricated by depositing and processing epitaxial layers on the sapphire substrate 12. Such GaN-based LED devices could consist of multiple epitaxial layers of un-doped GaN, n-type GaN doped with Si, multiple quantum wells having InGaN/GaN layers, p-type AlGaN doped with Mg, and p-type GaN doped with Mg. Of course, other types of semiconductor devices, such as laser diodes and/or electronic devices, could be formed on the sapphire substrate 12.

There are two ways to form scribe lines using ICP RIE; either before semiconductor devices 14 are formed or right after epitaxial growth. A mask pattern 16 is formed on the epitaxial side of the substrate wafer using photolithography processes. The mask pattern 16 provides accurately controlled scribe lines 15 that define the individual semiconductor devices 14. In practice, the scribe lines 15 are beneficially 5 µm or 10 µm wide. The thickness of the mask pattern 16 impacts on the etch selectivity of the sapphire substrate 12 over the mask pattern 16. Thus, the thickness of the mask pattern 16 can be adjusted as required to provide a suitable etch selectivity.

Figure 2:
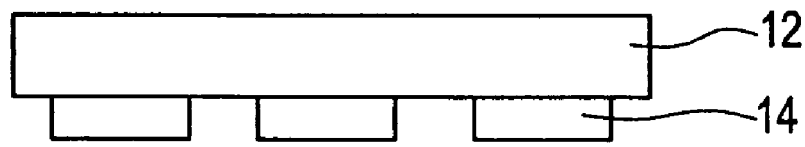
FIG. 2 illustrates the substrate of FIG. 1 after being thinned.

Turning now to FIG. 2, after the individual semiconductor devices 14 are formed, the backside of the sapphire substrate 12 is thinned and/or polished by mechanical grinding and lapping. Alternatively, as subsequently described, the sapphire substrate 12 could be thinned using ICP RIE etching (however, since the ICP RIE etch rate is around 0.3 µm/min, it is probably not practical to thin thick sapphire substrates using ICP RIE). The initial sapphire substrate typically would have a thickness of around 330 to 430 µm, and after thinning that thickness might be reduced to less than 100 µm. Another approach is to form scribe lines after device formation and wafer thinning and polishing.

Figure 3:
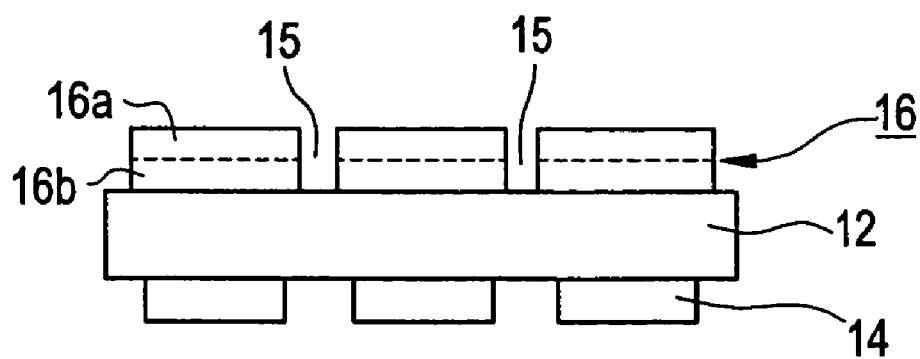
FIG. 3 illustrates the substrate of FIG. 2 after a mask pattern is formed on the backside or front side (the device-side).

Turning now to FIG. 3, after thinning, a mask pattern 16 is formed on the backside of the thinned sapphire wafer 12 using photolithography processes. The mask pattern 16 provides accurately controlled scribe lines 15 that defined the individual semiconductor devices 14. In practice, the scribe lines 15 are beneficially 5 µm or 10 µm wide. It should be noted that the scribe line widths are much less than the 50 to 150 µm scribe lines typically formed using a diamond-cutting wheel or stylus. The thickness of the mask pattern 16 impacts on the etch selectivity of the sapphire substrate 12 over the mask pattern 16. Thus, the thickness of the mask pattern 16 can be adjusted as required to provide a suitable etch selectivity.

The mask pattern 16 is beneficially fabricated from a relatively hard photo-resist material that withstands intense plasma, from a metal material that withstands intense plasma, or from both. For example, still referring to FIG. 3, the mask pattern 16 can include a photo-resist layer 16a, a metal layer 16b, or both. The photo-resist layer 16a could be AZ 9260 (a product of the Clariant Co.), while the developer used to develop the photo-resist layer 16a to form the scribe lines 15 could be AZ MIF 500 (another product of the Clariant Co.). A suitable metal layer 16b is Cr, Ni, or Mo, etc. An approximate 100 nm-thick hard metal layer can be prepared by physical vapor deposition (PVD).

The following relates primarily to fabricating a suitable photo-resist layer 16a. Prior to photo-resist deposition, a room temperature HMDS treatment is performed to remove water molecules from the sapphire substrate 12 by dehydration. Then, the photo-resist coating is applied by spin coating to produce a photo-resist having a thickness of about 12 microns (preferably in the range of 10–20 microns). In practice, the thickness of the photo-resist should be about the same as the etch depth into the sapphire substrate. This depth uniforming helps ensure that the photo-resist remains intact during sapphire etching. Because it is difficult to form a 12 micron thick photo-resist coating in one step, the photo-resist is beneficially applied in two coats, each about 6 microns thick. The first photo-resist coat is spin coated on and then soft baked at 90° C. for about 15 minutes. Then, the second photo-resist coat is applied in a similar manner, but is soft baked at 110° C. for about 8 minutes.

Still referring to FIG. 3, the photo-resist coating is then patterned to form the scribe lines 15. This is beneficially performed using lithographic techniques; Development takes a relatively long time because of the thickness of the photo-resist coating. After development, the photo-resist patterns 16 are hard baked at about 80° C. for about 30 minutes. Then, the hard baked photo-resist is beneficially dipped in a MCB (Metal Chlorobenzene) treatment for about 3.5 minutes. Such dipping further hardens the photo-resist.

Further to paragraph [0036], the metal layer 16b can also be formed using standard metal deposition/plating techniques. Reference can, of course, be had to the literature.

Figure 4:
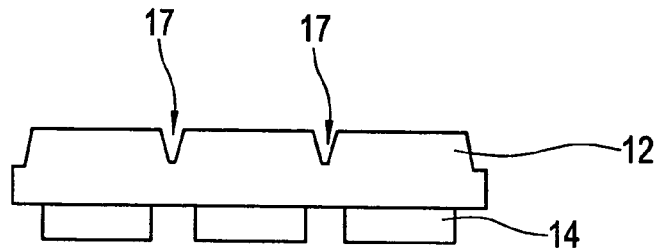
FIG. 4 shows a cross-sectional view of the substrate of FIG. 3 after ICP RIE etching and after removal of the mask pattern residue.

Referring now to FIG. 4, after the mask pattern 16 is prepared, the sapphire substrate 12 is etched by ICP RIE (described in more detail subsequently) through the mask pattern 16. Any residual mask material is then removed. The etched result creates trenches 17 that extend into the sapphire substrate 12.

Figure 5A:
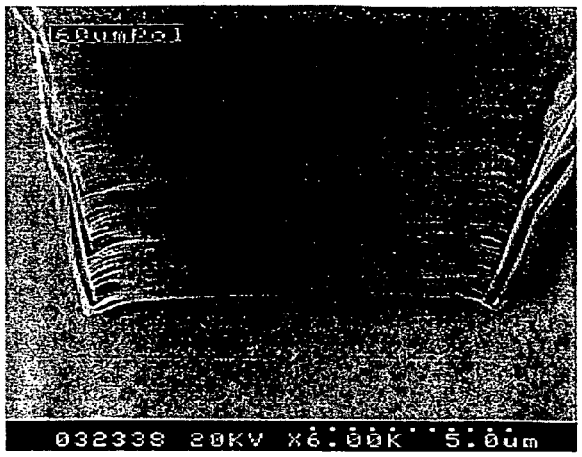
FIGS. 5a and 5b show cross-sectional and perspective scanning electron microscope pictures of a trench formed by a nearly optimized ICP RIE etching process.
Figure 5B:
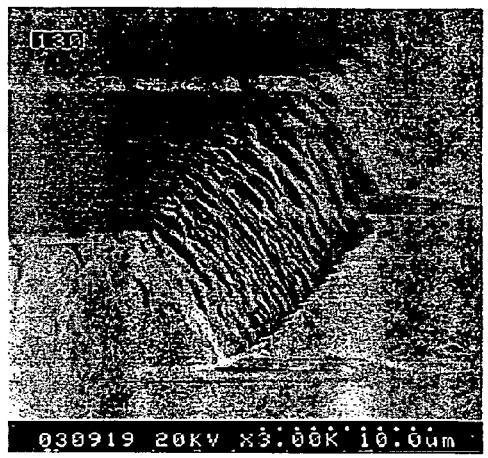
Figure 6A:
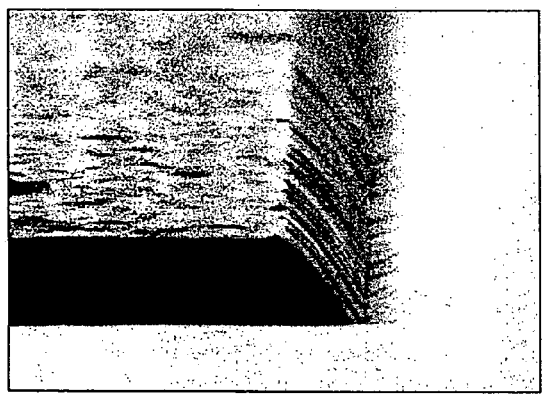
FIGS. 6a and 6b show cross-sectional and perspective scanning electron microscope pictures of a trench formed by another nearly optimized ICP RIE etching process.
Figure 6B:
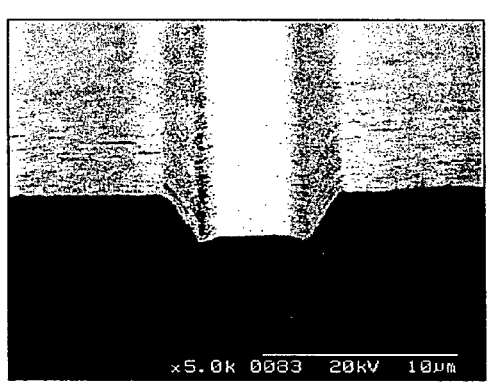

To assist subsequent separation of individual semiconductor devices, trench etching is optimized to produce notches. A notch is a particularly deep, sharply pointed depression that extends downward from the sidewalls of the trench. FIGS. 5a and 5b show a scanning electron microscope picture of a trench with notches formed in a photo-resist layer using ICP RIE etching. Additionally, FIGS. 6a and 6b show a scanning electron microscope picture of a trench with notches formed in a metal (Mo) layer using ICP RIE etching. It should be pointed out that notch formation depends on the etched material and the ICP RIE conditions. Examples of suitable conditions to fabricate the trenches shown in FIGS. 5a–5b and 6a and 6b, are provided subsequently.

Figure 7:
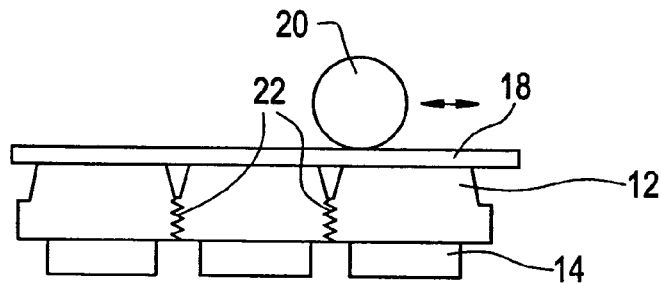
FIG. 7 illustrates the substrate of FIG. 4 after a supporting tape is attached to the backside of the substrate.
Figure 8:
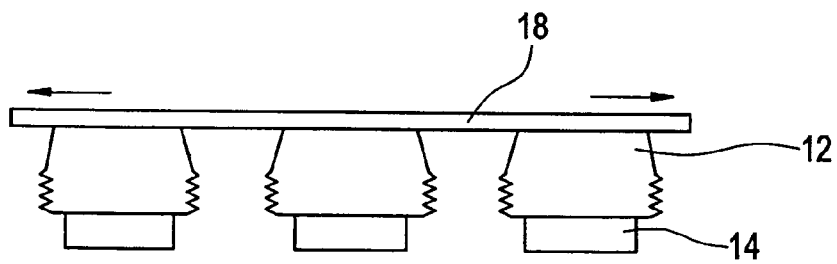
FIG. 8 illustrates the substrate of FIG. 7 after rolling by a steel roller.

After trench forming the individual semiconductors on the sapphire substrate 12 must be separated. FIGS. 7 and 8 illustrate one method of substrate 12 separation. Turning now specifically to FIG. 7, a supporting tape 18 is attached to the backside of the sapphire substrate 12. A steel roller 20 is then rolled across the back of the supporting tape 18. This action creates stress lines 22 that extend from the etched channels 17 through the sapphire substrate 12. The formation of notches in the trenches assists in the creation of the stress lines 22.

Then, as shown in FIG. 8, further rolling of the steel roller causes the stress lines to break, resulting in dicing of the sapphire substrate 12 along the etched channels 17 such that the individual semiconductor devices 14 are separated. The supporting tape is then stretched (expanded) and the individual semiconductor devices 14 can be removed from the tape. Those individual semiconductor devices 14 can then be removed from the supporting tape 18 and subsequently integrated into a device package or higher-level assembly.

Figure 9:
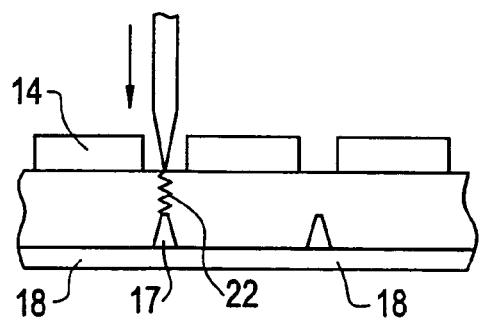
FIG. 9 illustrates the substrate of FIG. 4, after being turned over, being stressed by a knife-edge.

FIG. 9 illustrates another method of separating the individual semiconductor devices 14. To do so, the supporting tape 18 is again attached to the backside of the sapphire substrate 12, reference FIG. 7. The structure is then inverted and a knife-edge 24 is forced from the top down toward the trenches. This action, often referred to as shear cutting, creates stress lines 22 that extend from the etched channels 17 through the sapphire substrate 12. Again, the formation of notches in the trenches assists this action. The supporting tape is then stretched and the individual semiconductor devices 14 are removed.

The foregoing has only described the case where the mask pattern 16 and its scribe lines 15 are on the backside of the sapphire substrate. However, it should be noted that this is not a requirement. For example, the photo-resist pattern can be applied over the individual semiconductor devices. This locates the trenches 17 between the individual semiconductor devices. This has the distinct advantage of the trenches being unaffected by the thinning of the substrate.

Figure 10:
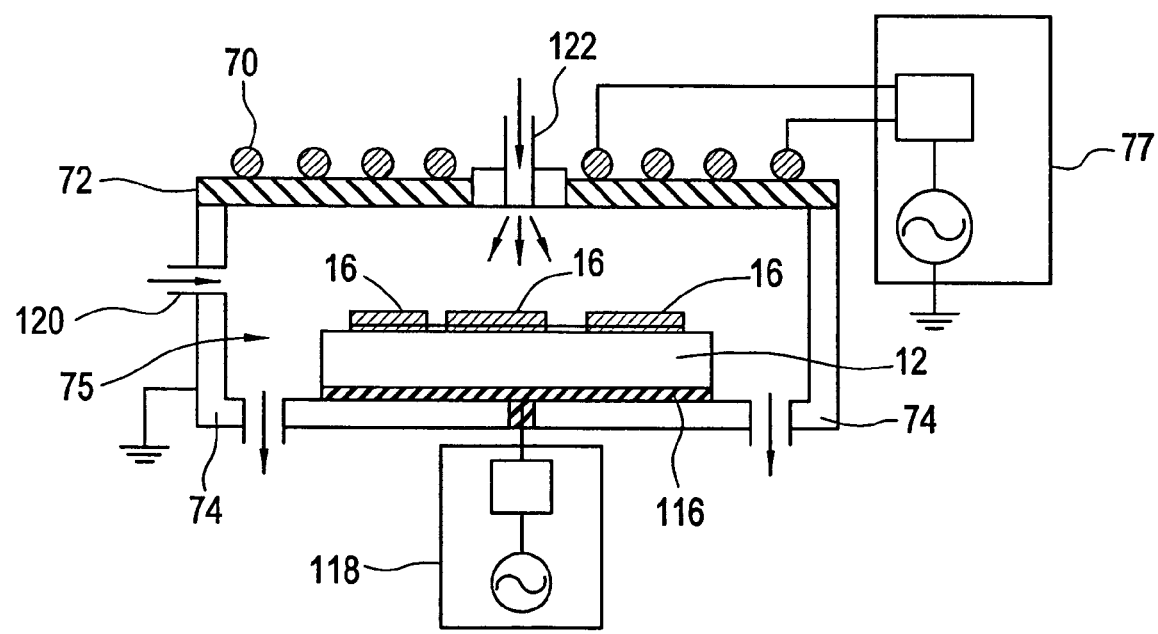
FIG. 10 illustrates an apparatus suitable for performing ICP RIE on substrates.

The ICP RIE etching process discussed above is beneficially a planar type ICP. A suitable apparatus for practicing ICP RIE etching is illustrated in FIG. 10. A 2.5-turn or so spiral Cu coil 70 is located above an insulating window 72 (beneficially a 1 cm-thick quartz window) that covers a grounded metallic shield 74 to form a chamber 75. Radio frequency (RF) power at 13.56 MHz is applied to the coil 70 from an RF source 77. It should be noted that magnetic fields are produced at right angles to the insulating window 72, by the RF power.

Still referring to FIG. 10, a sapphire substrate 12 is located in the chamber 75 on a bottom electrode 116. The bottom electrode 116 is connected to a bias voltage supply 118 that biases the sapphire substrate 12 to enable etching. The bias voltage supply 118 beneficially supplies 13.56 MHz RF power and a DC-bias voltage. The distance from the insulating window 72 to the bottom electrode 116 is beneficially about 6.5 cm. A gas mixture of $Cl_2$ and $BCl_3$, and possibly Ar, are injected into the chamber through a reactive gas port 120. Furthermore, electrons are injected into the chamber via a port 122.

Electrons present in the electromagnetic field produced by the coil 70 collide with neutral particles of the injected gases, resulting in the formation of ions and neutrals, which produce plasma. Ions in the plasma are accelerated toward the sapphire substrate 12 by the bias voltage applied by the bias voltage supply 118 to the electrode 116. The accelerated ions pass through the scribe lines 15 to the sapphire substrate 12, causing the etch channels 17 (see FIGS. 4 and 5) to form.

While not optimum in all chambers and all applications, suitable ICP RIE process parameters include an RF power of 400 W to 2,000 W, a bias voltage supply of −100 to −400 VDC, and a process pressure of 5 to 40 mTorr. As previously discussed, the ICP RIE process is suitable both for trench etching and thinning. Of course, the time duration is different between trench etching and thinning. Furthermore, thinning is performed without photo-resist.

To investigate the degree of smoothing achievable by etching, lapped blank sapphire wafers having a surface roughness of 12.95 nm and polished wafers were patterned using a conventional photo-resist to measure the etch profile and etch selectivity. The etch characteristics of sapphire were measured as a function of gas combination Of $Cl_2/BCl_3$ and $Ar/Cl_2/BCl_3$, at various inductive power (400~800 Watts), bias voltage (−100~−300 Volts), and operational pressure (1.33~5.33 Pa) levels. In all cases the sapphire substrate temperature was fixed at about 70° C. The etch rates of the sapphire substrate and the photo-resist were estimated using a stylus profilometer by measuring the feature depths before and after the removal of the photo-resist. The results follow.

By using a metal (Cr) and photo-resist mask pattern as described above, a certain depth of etching was performed using various gas mixtures of $Cl_2$ and $BCl_3$ and Ar during inductively coupled plasma etching. At RF powers of 600 W and 800 W, with a −300 VDC bias voltage, a 4.0 Pa process pressure, and at 70° C., increasing the proportion of $BCl_3$ in $Cl_2/BCl_3$ to 50% generally increases the sapphire etch rates. However, further increasing $BCl_3$ beyond 50% begins to decrease the etch rates. Higher inductive power increased the sapphire etch rate. The highest sapphire etch rate obtained using 50% $Cl_2$ and 50% $BCl_3$ at 800 W of inductive power was 362.7 nm/min. However, the highest etch selectivity of sapphire verses photo-resist was obtained using 100% $BCl_3$ at 800 W of inductive power.

The addition of 20% Ar to 50% $Cl_2$+50% $BCl_3$ increased the sapphire etch rate slightly. However, further increasing Ar rapidly decreased the etch rate. The highest etch rate obtained using $Ar/Cl_2/BCl_3$ at 800 W inductive power was 377.5 nm/min. The etch selectivity of sapphire verses photo-resist generally decreased with increased Ar.

The effects of RF power, dc-bias, and process pressure on the sapphire etch rates have also been investigated. Increasing RF power generally increases the sapphire etch rate and the etch selectivity. This appears to be related to increased chemical and physical reactions of sapphire with increased reactive radical densities and plasma ion density. Increasing etch selectivity also appears related to enhanced chemical reaction of sapphire verses photo-resist.

Increasing the dc-bias voltage tends to increase the sapphire etch rate. However, etch selectivity was found to be relatively insensitive to the dc-bias voltage. The increase of sapphire etch rate with an increased dc-bias voltage appears to be related to increased physical sputtering due to the increase of ion bombardment energy. The relative insensitivity of the etch selectivity is possibly related to the increased etch rates of both the photo-resist and the sapphire with increased ion bombardment.

The sapphire etch rate and the etch selectivity were found to increase with increased process pressure, at least until 4.0 Pa was reached. Further increasing the process pressure was found to decrease the sapphire etch rate and etch selectivity. The increase of the sapphire etch rate with increased process pressure appears to be related to the increase of radical densities in the plasmas. However, the decreasing sapphire etch rate at higher process pressures appear to be caused by both scattering of incident ions and re-depositions of etch products. The highest sapphire etch rate and etch selectivity obtained was 377.5 nm/min at 30 mTorr operational pressure and 800 W of RF power.

As previously noted, notch formation in the trench enhances die separation since notches efficiently initiate stress cracks. This is because notches have higher stress concentration factors than other areas in a trench. As a result, cracks are selectively initiated in the notch, which makes breaking hard substrates easier. The notches a result of proper ICP RIE gas compositions and etch parameters. Very good results have been obtained using an ICP RIE gas composition of 40% $BCl_3$/40% $Cl_2$/20% Ar with the ICP RIE apparatus of FIG. 10 being set up with a power/bias voltage of 600 W/−300V, and an operational pressure of 30 mTorr. Referring now to FIG. 3, the mask pattern 16 that was used to produce FIGS. 5a and 5b was comprised of a photo-resist layer (16a) about 24 $\mu$M thick. The etch depth into the sapphire substrate was about 12 $\mu$m. As shown in FIGS. 5a and 5b, the high-density plasma during the ICPRIE process curved and heavily damaged the sidewalls, which were GaN and sapphire. However, the photo-resist mask pattern 16 survived the etch process.

Mask pattern 16 degradation can be reduced by using either a metal or a combination metal and photo-resist mask pattern 16. FIGS. 6a and 6b show typical etch profiles of GaN/sapphire wafers using a Cr or Mo metal mask pattern 16 (being therefore a mask pattern 16b). Unlike when using a photo-resist mask, when using a metal mask patterns the sidewalls maintain their verticality throughout the etch process. Also, it should be noted that when using a metal mask pattern 16 the notches are formed at a shallow etch depth. For example, FIGS. 6a and 6b illustrate the results from using a 1.8 μm-thick Mo mask pattern 16 on a sapphire substrate 12 that is 70–90 μm thick, with a distance between cells (individual semiconductor devices 14) of 5 μm, a gas composition of 80% $BCl_3$/20% $Cl_2$ (24/6 sccm), and an ICP RIE set up of power/bias voltage of 800 W/−250V and an operational pressure of 6.2 mTorr. Good notches were produced at an etch depth of 2.7 μm.

Etch profiles when thinning sapphire were examined at an etch condition of 20% Ar/40% $Cl_2$/40% $BCl_3$, 800 W of inductive power, 4.0 Pa of operational pressure, −300V of dc-bias voltage, and 70 C substrate temperature. A photoresist masked sapphire was etched and the etch profile was observed using SEM (Scanning Electron Microscopy) and AFM (Atomic Force Microscopy). After etching the sapphire surface for 12 minutes using ICP RIE, the surface roughness was found to be 1.43 nm, while the surface roughness of mechanically lapped and polished sapphire surfaces were found to be 12.95 nm and 5.38 nm, respectively. Therefore, the results indicate that not only can a smooth etch profile be obtained, but that a smooth etch surface can be produced using ICP RIE dry etching.

Highlights of ICP RIE Etching are as follows:

Inductively coupled plasma reactive ion etching as described above provides numerous benefits when fabricating semiconductor devices on hard substrates. Those benefits include:

Inductively coupled plasma reactive ion etching (ICP RIE) is suitable as the primary tool used to separate individual semiconductor devices on a substrate.

ICP RIE is suitable for separating many, possibly all, types of semiconductor device fabricated on hard substrates.

ICP RIE enables the use of standard lithographic techniques (such as mask patterns) to separating semiconductor devices fabricated on hard substrates.

ICP RIE can be used not only for scribe line formation, but also for wafer thinning and polishing.

ICP RIE enable narrow (5 μm or 10 μm) scribe lines, which increases device yields.

ICP RIE can produce notches (particularly deep, sharply pointed depressions) on the trench bottoms and that help initiate and propagate cracks.

ICP RIE etching can be performed in a planar fashion.

ICP RIE etching can be performed using a standard (or slightly modified) RIE apparatus, available gases (Cl2 and BCl3, HBr and Ar), and normal RIE conditions.

ICP RIE can produce smooth sapphire surfaces (the rms roughness of ICP RIE polished sapphire surface was found to be 1.43 nm).

The following comments regarding experimental conditions may be helpful.

ICP RIE mask patterns are beneficially fabricated from hard photo-resist materials, a metal material that withstands intense plasma, or both.

The photo-resist thickness should be about the same as the etch depth into the sapphire substrate.

One way to obtain a notch is to etch through a 24 μm thick-photo-resist mask and into a sapphire substrate about 12 μm.

Process parameters used to form a notch using a PR mask were a gas composition of 40% BCl3/40% Cl2/20% Ar with the ICP RIE being set up with a power/bias voltage of 600 W/−300V, and an operational pressure of 30 mTorr, respectively.

Another way to obtain a notch is to incorporate a 1.8 μm-thick Mo mask on a sapphire substrate that is 70–90 μm thick, with a distance between cells of 5 μm. The etch depth into the sapphire substrate should be about 2.7 μm. The process parameters used to form a notch were a gas composition of 80% BCl3/20% Cl2, and an ICP RIE set-up of power/bias voltage of 800 W/−250V and an operational pressure of 6.2 mTorr, respectively.

Sapphires have been polished using ICP RIE with a gas mixture of 20% Ar/40% Cl2/40% BCl3, 800 W of inductive power, 4.0 Pa of operational pressure, −300V of dc-bias voltage, and 70 C substrate temperature for 12 minutes.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A method of polishing a substrate, comprising:
locating a substrate on an electrode within a reactive ion chamber;
evacuating the chamber;
applying RF power and a DC bias to the electrode; and
polishing the substrate using an inductively coupled plasma reactive ion etching (ICP RIE) process.

2. The method of claim 1, wherein the ICP RIE process includes heating the substrate to 70° C.

3. The method of claim 1, further including etching for 12 minutes.

4. A method of dicing a substrate, comprising:
forming a patterned mask over a surface of a substrate, the patterned mask defining scribe line regions on the surface of the substrate;
selectively forming notches in portions of the substrate within the scribe line regions using an inductively coupled plasma reactive ion etching (ICP RIE) process; and
dividing the substrate in correspondence with the notches formed in the portions of the substrate within the scribe line regions.

5. The method of claim 4, wherein the patterned mask includes photoresist material.

6. The method of claim 5, wherein forming the patterned mask includes:
forming a first photoresist layer over the substrate;
performing a first soft-bake by heating the first photoresist layer at 90° C. for about 15 minutes;
forming a second photoresist layer over the first photoresist layer;
performing a second soft-bake by heating the second photoresist layer at 110° for about 8 minutes;
patterning the first and second photoresist layers;
performing a hard-bake by heating the patterned photoresist layers at about 80° C. for about 30 minutes; and
dipping the hard-baked photoresist layers in Metal Chlorobenzene (MCB) for about 3.5 minutes.

7. The method of claim 4, wherein the patterned mask includes material selected from the group consisting of Cr, Mo, and Ni.

8. The method of claim 4, wherein the patterned mask defines scribe line regions 5 µm or 10 µm wide.

9. The method of claim 4, wherein the ICP RIE process includes generating an RF power of 400 W to 2000 W.

10. The method of claim 4, wherein the ICP RIE process includes generating an RF frequency of 13.56 MHz.

11. The method of claim 4, wherein the ICP RIE process includes generating a DC bias of 100 V to −400 W.

12. The method of claim 4, wherein the ICP RIE process includes etching the substrate at a pressure of 5 to 40 mTorr.

13. The method of claim 4, further comprising removing the patterned mask from the substrate before dividing the substrate.

14. The method of claim 4, further comprising thinning the substrate prior to selectively forming the notches.

15. A method of separating individual devices from a substrate, comprising:
    providing a substrate having a first surface a second surface opposing the first surface;
    at least partially forming a plurality of devices over the first surface, the plurality of at least partially formed devices being separated by scribe line regions of the substrate;
    forming a patterned mask on the substrate, the patterned mask exposing the scribe line regions of the substrate;
    selectively forming notches in portions of the substrate exposed by the patterned mask using an inductively coupled plasma reactive ion etching (ICP RIE) process; and
    separating the plurality of at least partially formed devices by dividing the substrate in correspondence with the notches formed in the portions of the substrate exposed by the patterned mask.

16. The method of claim 15, further comprising forming the patterned mask on the second surface.

17. The method of claim 15, further comprising forming the patterned mask on the first surface and on the plurality of at least partially formed devices.

18. The method of claim 15, wherein the plurality of at least partially formed devices include semiconductor devices.

19. The method of claim 15, wherein the plurality of at least partially formed devices include LED devices.

20. The method of claim 15, wherein the plurality of at least partially formed devices include laser diode devices.

* * * * *